United States Patent
Schultz et al.

(10) Patent No.: US 7,804,172 B2
(45) Date of Patent: Sep. 28, 2010

(54) ELECTRICAL CONNECTIONS MADE WITH DISSIMILAR METALS

(75) Inventors: Roger L. Schultz, Ninnekah, OK (US);
Michael L. Fripp, Carrollton, TX (US);
Haoyue Zhang, Dallas, TX (US);
Daniel D. Gleitman, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 810 days.

(21) Appl. No.: 11/329,317

(22) Filed: Jan. 10, 2006

(65) Prior Publication Data

US 2007/0158834 A1    Jul. 12, 2007

(51) Int. Cl.
*H01L 23/48* (2006.01)

(52) U.S. Cl. .................. 257/734; 257/741; 257/750; 257/E23.068; 257/E23.072

(58) Field of Classification Search ............ 257/734, 257/741
See application file for complete search history.

(56) References Cited

U.S. PATENT DOCUMENTS

| | | | |
|---|---|---|---|
| 4,690,480 A | 9/1987 | Snow et al. | |
| 4,934,952 A | 6/1990 | Banker | |
| 5,110,307 A | 5/1992 | Rapoza | |
| 5,298,683 A | 3/1994 | Taylor | |
| 5,975,410 A | 11/1999 | Slattery et al. | |
| 5,999,887 A | 12/1999 | Giannakopoulos et al. | |
| 6,069,395 A | 5/2000 | Yamaguchi et al. | |
| 6,077,415 A | 6/2000 | Duruz et al. | |
| 6,087,022 A | 7/2000 | Burris et al. | |
| 6,114,048 A | 9/2000 | Jech et al. | |
| 6,124,635 A | 9/2000 | Kuwabara | |
| 6,136,452 A | 10/2000 | Munir et al. | |
| 6,183,304 B1 | 2/2001 | Hollander et al. | |
| 6,248,286 B1 | 6/2001 | Lauf et al. | |
| 6,278,656 B1 | 8/2001 | Tyagi et al. | |
| 6,328,822 B1 | 12/2001 | Ishida et al. | |
| 6,375,877 B2 | 4/2002 | Lauf et al. | |
| 6,462,471 B1 | 10/2002 | Komiya et al. | |
| 6,465,744 B2 | 10/2002 | Baker et al. | |
| 6,475,254 B1 | 11/2002 | Saak et al. | |
| 6,596,040 B2 | 7/2003 | Saak et al. | |

(Continued)

FOREIGN PATENT DOCUMENTS

JP    9046978 A    2/1997

OTHER PUBLICATIONS

"Functionally Graded Materials for Erosion and Wear Resistance in Downhole Applications", dated Mar. 18, 2005.

(Continued)

*Primary Examiner*—Roy K Potter
(74) *Attorney, Agent, or Firm*—Marlin R. Smith

(57) ABSTRACT

Electrical connections between different materials. An electrical connection system includes electrical components and an electrical connection between the electrical components. The electrical connection includes a functionally graded material. A method of making an electrical connection between different materials includes the steps of: providing an electrical component which includes a material; providing another electrical component which includes another material; and electrically connecting a functionally graded material between the electrical components. An electrical connection system includes an electrical component and a functionally graded material electrically connected to the electrical component. The functionally graded material provides a gradual transition between at least two dissimilar materials.

26 Claims, 3 Drawing Sheets

U.S. PATENT DOCUMENTS

| | | |
|---|---|---|
| 6,641,893 B1 | 11/2003 | Suresh et al. |
| 6,669,989 B2 | 12/2003 | Movchan et al. |
| 6,825,743 B2 | 11/2004 | Rumpf, Jr. et al. |
| 6,863,992 B2 | 3/2005 | Weihs et al. |
| 6,899,265 B2 | 5/2005 | Miyasaka et al. |
| 6,916,386 B2 | 7/2005 | Ishida et al. |
| 7,473,482 B2 | 1/2006 | Hart et al. |
| 7,417,316 B2 | 8/2008 | Naito et al. |
| 2001/0033039 A1 | 10/2001 | Lauf et al. |
| 2002/0043307 A1 | 4/2002 | Ishida et al. |
| 2002/0081447 A1 | 6/2002 | Movchan et al. |
| 2003/0093956 A1 | 5/2003 | Saak et al. |
| 2004/0104797 A1 | 6/2004 | Hall et al. |
| 2005/0092403 A1 | 5/2005 | Lloyd |
| 2005/0263261 A1 | 12/2005 | Moore et al. |
| 2005/0266220 A1 | 12/2005 | LaForest et al. |
| 2005/0276717 A1 | 12/2005 | Fang et al. |
| 2006/0046520 A1 | 3/2006 | Padhi et al. |

OTHER PUBLICATIONS

International Search Report and Written Opinion issued for International Application No. PCT/US07/60272 dated Feb. 20, 2008 (9 pages).

English translation of Abstract of Japanese publication 9046978 (A), espacenet.com, Nov. 5, 2009, 1 page.

ELECTRICAL CONNECTIONS MADE WITH DISSIMILAR METALS

BACKGROUND

The present invention relates generally to systems and methods for making electrical connections and, in an embodiment described herein, more particularly provides for electrical connections made between dissimilar metals.

There are many circumstances in which electrical components are connected by directly connecting dissimilar metals to each other. For example, an electrical component having a gold contact may be connected to an aluminum wire by connecting the gold material directly to the aluminum material (e.g., by wire-bonding, electrical resistance welding, etc.).

Unfortunately, such electrical connections between dissimilar metals are relatively unreliable. One reason for this unreliability is that the metals have different thermal coefficients of expansion, and thermal cycling will result in eventual fatigue failure of the connection. Another reason for this unreliability is due to electrolytic cell corrosion at the connection.

Therefore, it may be seen that improvements are needed in the art of making electrical connections between dissimilar materials.

SUMMARY

In carrying out the principles of the present invention, an electrical connection system is provided which solves at least one problem in the art. One example is described below in which a functionally graded material is electrically connected between dissimilar materials. Another example is described below in which the functionally graded material is incorporated into an electrical component.

In one aspect of the invention, an electrical connection system includes electrical components and an electrical connection between the electrical components. The electrical connection includes a functionally graded material.

In another aspect of the invention, a method of making an electrical connection between different materials includes the steps of: providing an electrical component which includes a material; providing another electrical component which includes another material; and electrically connecting a functionally graded material between the electrical components.

In yet another aspect of the invention, an electrical connection system includes an electrical component and a functionally graded material electrically connected to the electrical component. The functionally graded material provides a gradual transition between at least two dissimilar materials.

These and other features, advantages, benefits and objects of the present invention will become apparent to one of ordinary skill in the art upon careful consideration of the detailed description of representative embodiments of the invention hereinbelow and the accompanying drawings, in which similar elements are indicated in the various figures using the same reference numbers.

DETAILED DESCRIPTION

It is to be understood that the various embodiments of the present invention described herein may be utilized in various orientations, such as inclined, inverted, horizontal, vertical, etc., and in various configurations, without departing from the principles of the present invention. The embodiments are described merely as examples of useful applications of the principles of the invention, which is not limited to any specific details of these embodiments.

In the following description of the representative embodiments of the invention, directional terms, such as "above", "below", "upper", "lower", etc., are used for convenience in referring to the accompanying drawings. In general, "above", "upper", "upward" and similar terms refer to a direction ascending vertically away from the earth's surface, and "below", "lower", "downward" and similar terms refer to a direction descending vertically toward the earth's surface.

Figure 1:
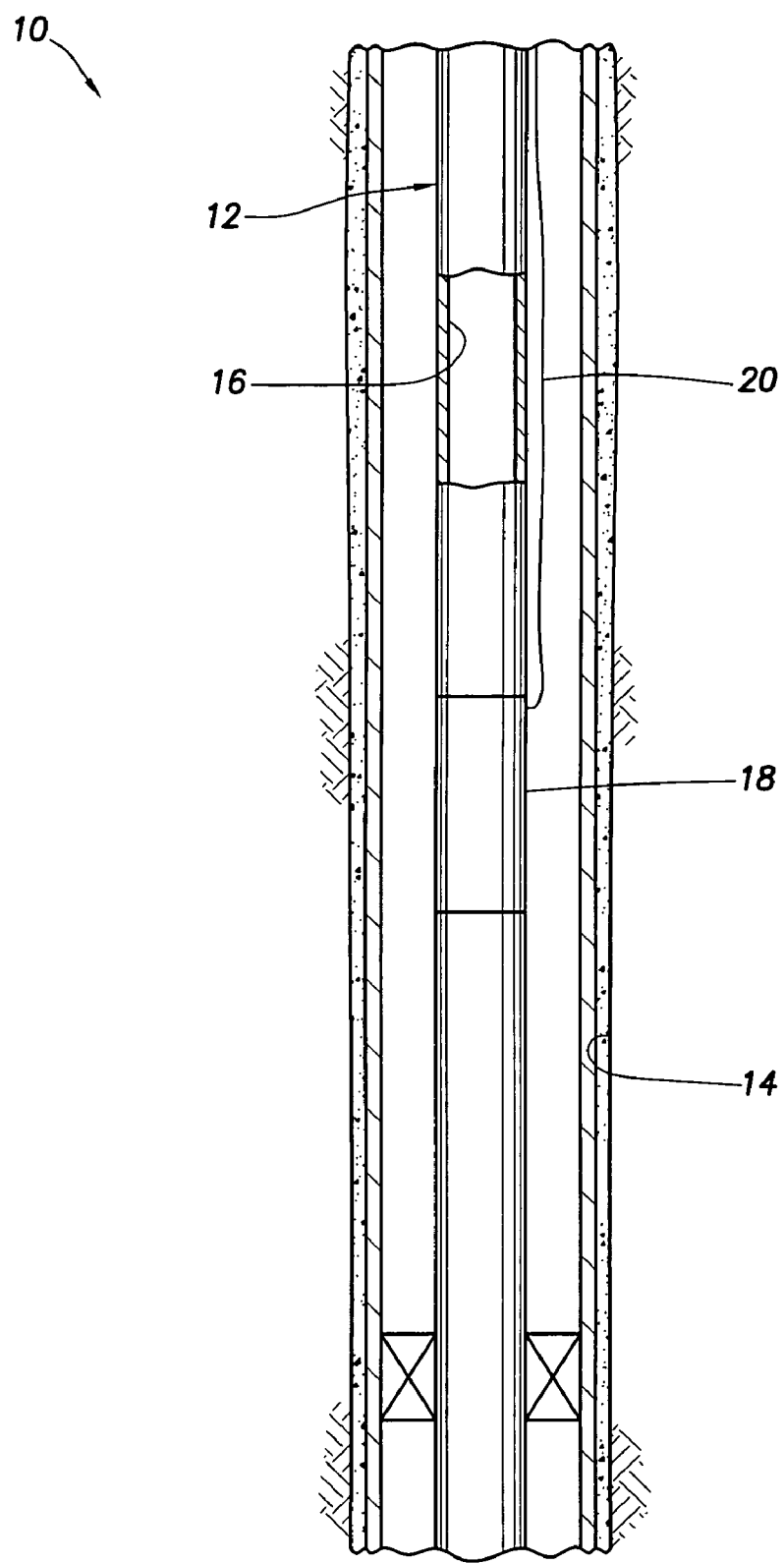
FIG. 1 is a schematic partially cross-sectional view of a well system embodying principles of the present invention.

Representatively illustrated in FIG. 1 is a well system 10 which embodies principles of the present invention. A tubular string 12 is positioned in a wellbore 14. Fluid is produced from, and/or injected into, the wellbore 14 via a passage 16 in the tubular string 12.

A well tool 18 is interconnected in the tubular string 12. The well tool 18 could be any type of well tool, such as a pressure, temperature or other type of sensor, a valve or other type of flow control device, etc. The well tool 18 may communicate with the surface or other remote location via a line 20, or such communication could be via telemetry.

The well tool 18 includes electrical circuitry with electrical components having dissimilar materials which must be connected to each other. Preferably, the connections between the electrical components are highly reliable, since a failure will require expensive and time-consuming retrieval of the well tool 18. Thermal cycling is a factor in reliability of the electrical connections, since fluids flowed through the passage 16 will have varying temperatures, and conveyance of the well tool 18 into and out of the wellbore 14 causes a large temperature change in the electrical circuitry. Fatigue is a factor in reliability of the electrical connections, since the electrical circuitry experiences vibration due to conveyance of the well tool 18 into and out of the wellbore 14, and due to flow of fluid through the passage 16.

It should be clearly understood that the well system 10 is provided as an example of a situation in which the principles of the invention will find beneficial use. However, the invention is not limited to use in the well tool 18, in the well system 10, or in any particular application. Instead, the invention has a wide variety of uses in a virtually unlimited number of applications.

For example, the principles of the invention may be used in applications at the earth's surface, in consumer products, in aerospace, in medical devices, in automobiles, in electrical power generation and transmission (such as, in power lines and power switching stations), in process controls, in foundries, in refineries, in various industries, etc. Thus, it will be appreciated that the invention can be used in any circumstance in which an electrical connection is to be made between dissimilar materials.

The invention is particularly useful in circumstances in which electrical connections between dissimilar materials have in the past been prone to failure, for example, in hostile environments where such electrical connections are subjected to temperature extremes, thermal cycling, vibration, or combinations of these, etc. Such circumstances which have previously caused increased failure rates may be found in well systems, well tools, tool modules, any systems employing electronics, etc.

When used in conjunction with well operations, the invention could be utilized during drilling, logging, completion, production monitoring/control and/or other types of operations.

Figure 2:
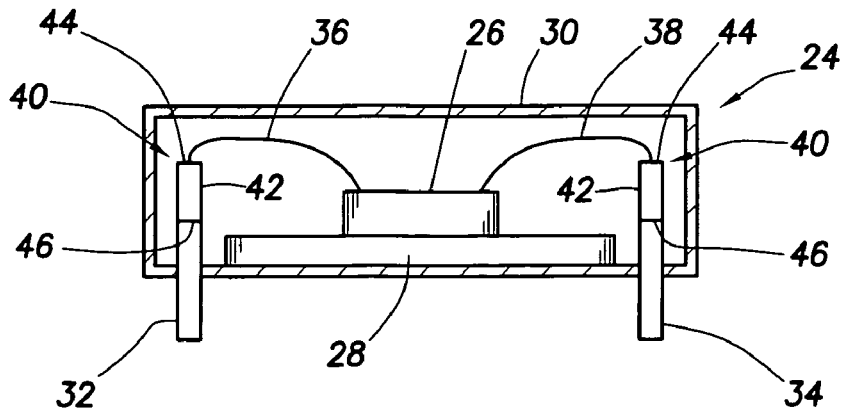
FIG. 2 is an enlarged scale cross-sectional view of an electrical connection system which may be used in the well system of FIG. 1.

Referring additionally now to FIG. 2, a schematic cross-sectional view of an integrated electronic circuit package 24 is representatively illustrated. The package 24 may be included in the electrical circuitry of the well tool 18. Alternatively, the package 24 could be used in any other electronic or electrical device.

Note that the invention could be incorporated into other types of electrical packages. For example, a microcircuit material package or a discrete device package could include an electrical connection made between dissimilar materials.

The package 24 includes a circuit die 26 attached to a substrate 28. The die 26 and substrate 28 are contained within an outer housing 30. Electrical contact pins 32, 34 are used to electrically connect the die 26 (and any other electrical components on the substrate 28) to electrical circuitry external to the housing 30.

Wires 36, 38 are used to electrically connect contacts or pads (not visible in FIG. 2) on the die 26 to the pins 32, 34. The contacts on the die 26 are typically made of aluminum, and the pins 32, 34 are typically made of gold or are gold plated. Thus, an electrical connection must be made between these dissimilar materials.

Note that the terms for metals (such as "aluminum," "gold," etc.) used herein also indicate alloys of the respective metals, and further indicate coatings, platings, etc. using the metals. Thus, the contacts on the die 26 could be made of an aluminum alloy, and the pins 32, 34 may be considered "gold" pins, even though they may be merely gold plated, since at least an electrical contact surface on each of the pins is made of gold.

Since the package 24 is subjected to vibration in use, it is preferred that the wires 36, 38 be made of an aluminum material. Aluminum is stronger and lighter than gold. Thus, the connections between the wires 36, 38 and the contacts on the die 26 may not be made between dissimilar materials, but the connections between the wires and the pins 32, 34 will be made between dissimilar materials.

In an important feature of the invention, an electrical connection system 40 is used to provide a reliable electrical connection between the dissimilar materials of the wires 36, 38 and the pins 32, 34. Specifically, the system 40 includes a functionally graded material 42 electrically connected between the respective wires 36, 38 and pins 32, 34.

Functionally graded materials (also known as functional gradient materials) are materials within which there is a gradual transition in properties. The gradual transition in properties is due to a gradual transition in microstructure and/or composition. The structural benefits of functionally graded materials are well known to those skilled in the art. For example, see "Development and Field Test of a Stabilizer with FGM Blades," Society of Petroleum Engineers paper no. 59423 (pub. 2000).

The gradual transition in properties can be accomplished using any of a variety of techniques. For example, techniques such as powder metallurgy and/or centrifugal casting may be used to produce a continuously graded transition in properties. Any particle size or combination of particle sizes (including but not limited to nano-particles) may be used in the process of producing the gradual transition in properties.

As another example, a gradual stepwise transition in properties may be produced using a series of many thin layers, with each layer having an incremental transition in properties (e.g., each layer having a ratio of the materials, with the ratio incrementally changing between intermediate layers). Any technique or combination of techniques may be used to produce the gradual transition in properties, in keeping with the principles of the invention. See W. H. Jiang and R. Kovacevic, *Development of Functional Gradient Materials (FGMS)* and references cited therein for descriptions of various techniques for producing the gradual transition in properties in functionally graded materials.

Figure 4:
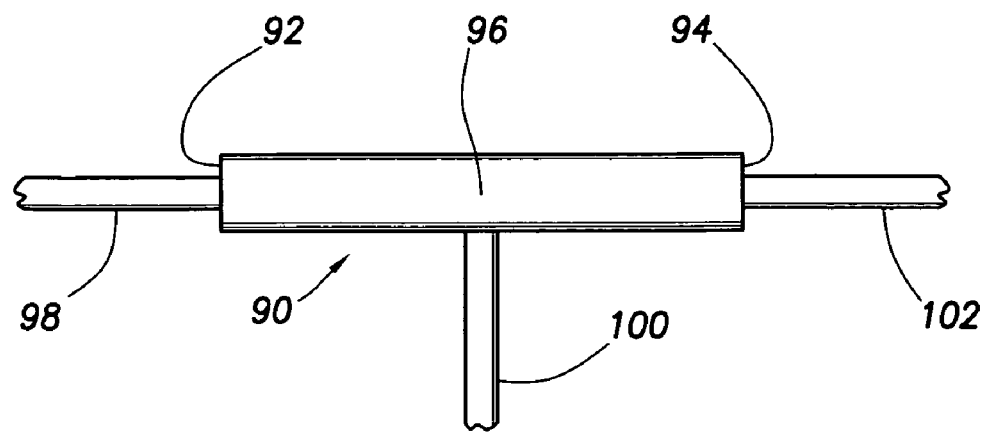
FIG. 4 is an enlarged scale schematic view of a three-way functionally graded material.

It is not necessary for a functionally graded material to provide a gradual transition in properties between only two materials. For example, a functionally graded material could provide a gradual transition in properties between three or more materials as depicted in FIG. 4 and described more fully below.

Figure 5:
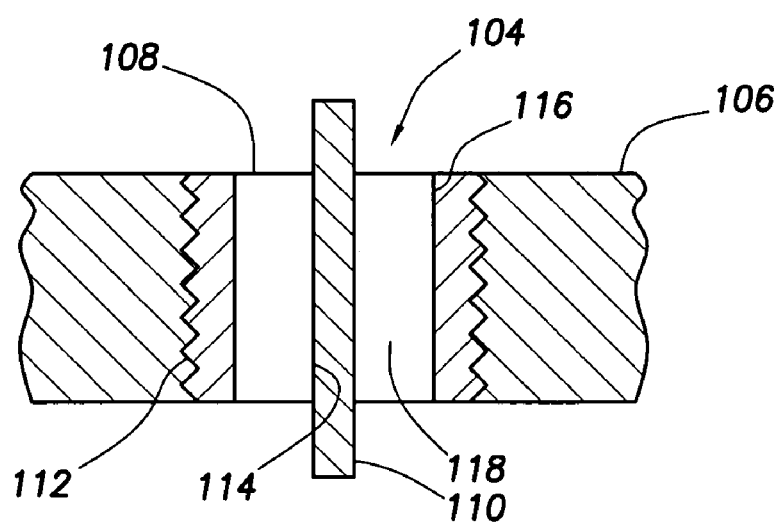
FIG. 5 is a schematic view of another three-way functionally graded material.

It is not necessary for a functionally graded material to only provide a gradual transition in properties between metals. For example, a functionally graded material could provide a gradual transition in properties between a metal and a semiconductor, between a metal or semiconductor and a ceramic, between a metal or semiconductor and an insulator, etc. The semiconductor could provide a type "p" or type "n" junction, for example, for use in a Peltier device. An example of a three-way metal-insulator-metal functionally graded material is depicted in FIG. 5 and described more fully below.

In the system 40, the functionally graded material 42 has an upper contact portion 44 which consists substantially exclusively of aluminum, and a lower contact portion 46 which consists substantially exclusively of gold. A gradual transition between aluminum at the upper portion 44 and gold at the lower portion 46 is made in the functionally graded material 40. This gradual transition may be accomplished using a variety of methods known to those skilled in the art, such as sintered metal powder mixtures, centrifugal casting, layers with incremental property transitions between the layers, etc., as discussed above.

The upper portion 44 is attached to the wires 36, 38 and the lower portion 46 is attached to the pins 32, 34 using conventional techniques (such as soldering, electron beam welding, etc.). Note that, due to the use of the functionally graded material 42, these attachments do not require any direct connections between dissimilar materials. Furthermore, fatigue due to thermal cycling, electrolytic corrosion and other problems associated with electrical connections between dissimilar materials are eliminated in the system 40.

It should be clearly understood that, although the above example of connecting aluminum contacts on the die 26 to the gold pins 32, 34 using aluminum wires 36, 38 has been used to demonstrate a circumstance in which the principles of the invention are beneficial, the invention is not limited to this example. The die contacts, pins 32, 34 and wires 36, 38 could be made of other materials, or other combinations of materials. For example, the pins 32, 34 could be made of aluminum and the wires could be made of gold, etc. As another example, other types of electrical components could be connected using the principles of the invention.

Figure 3:
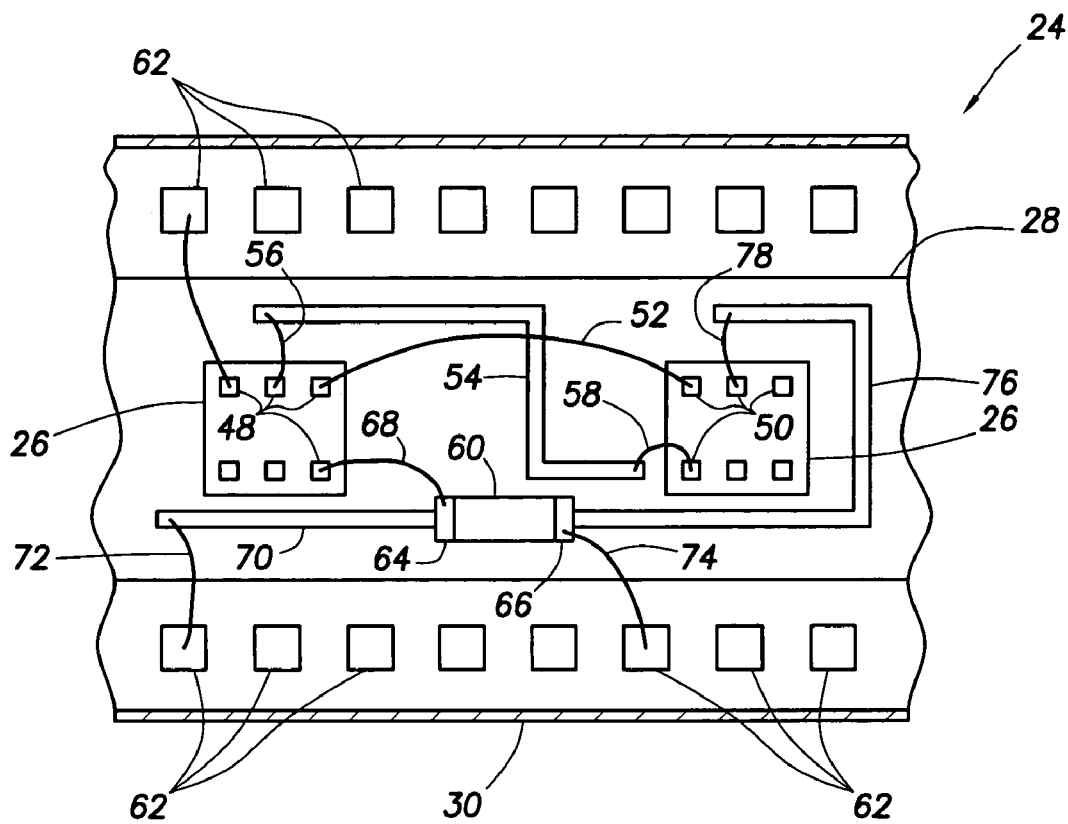
FIG. 3 is a top plan view of an alternate configuration of the electrical connection system.

Referring additionally now to FIG. 3, an alternate configuration of the package 24 is representatively illustrated from a top view at a somewhat enlarged scale. Elements which are the same or similar to those depicted in FIG. 2 are indicated in FIG. 3 using the same reference numbers.

FIG. 3 is provided to demonstrate a few additional examples of applications of the principles of the invention in the package 24. Again, it is important to understand that the principles of the invention are not limited to any of these examples.

Two dies 26 are used in the package 24 as depicted in FIG. 3. However, one of the dies 26 has pads or contacts 48 which are made of one material (such as aluminum), and the other die has pads or contacts 50 which are made of a dissimilar material (such as gold). In order to reliably connect one of the contacts 48 to one of the contacts 50, a functionally graded material 52 is used.

The functionally graded material 52 is constructed in the form of a wire. One end of the wire comprises substantially exclusively one material (such as aluminum) for connection to a contact 48, and the other end of the wire comprises substantially exclusively another material (such as gold) for connection to a contact 50. In this manner, an electrical connection is made between dissimilar materials of the contacts 48, 50, without directly connecting the dissimilar materials to each other.

Another method of accomplishing this result is to provide a functionally graded material 54 in the form of a conductive trace on the substrate 28. The trace could be "written" onto the substrate 28 in the manner of a printed circuit board, or the trace could be separately adhered or otherwise attached to the substrate. One end of the trace comprises substantially exclusively one material (such as aluminum) for connection to a contact 48 via an aluminum wire 56, and the other end of the trace comprises substantially exclusively another material (such as gold) for connection to a contact 50 via a gold wire 58.

A discrete electrical component 60 (such as a resistor, capacitor, inductor, transistor, diode, light emitting device, light sensitive device, transformer, motor, actuator, sensor, etc.) may be included in the package 24 and electrically connected to the dies 26 and/or pins 62. The component 60 has contacts 64, 66 for making these connections. The contacts 64, 66 may be made of any material, such as aluminum, gold, etc.

If the contact 64 is made of a dissimilar material relative to the contacts 48 or pins 62, functionally graded material may be provided in the form of a wire 68 connected between the contact 64 and one of the contacts 48, or in the form of a trace 70 on the substrate 28. Alternatively, the trace 70 could be made of the same material as the contact 64, and a functionally graded material could be provided in the form of a wire 72 interconnected between the trace and one of the pins 62.

If the contact 66 is made of a dissimilar material relative to the contacts 50 or pins 62, functionally graded material may be provided in the form of a wire 74 connected between the contact 66 and one of the pins 62, or in the form of a trace 76 on the substrate 28. Alternatively, the trace 76 could be made of the same material as the contact 66, and a functionally graded material could be provided in the form of a wire 78 interconnected between the trace and one of the contacts 50.

Note that the pins 62 could also be provided with functionally graded material, such as the material 42 attached to the pins 32, 34 in FIG. 2. Alternatively, the pins 62 could be formed of functionally graded material. For example, an upper end contact of each pin 62 could comprise substantially exclusively one material (such as aluminum) for connection to an electrical component within the package 24, and a lower end contact of each pin could comprise substantially exclusively another material (such as gold) for connection to an electrical component external to the package.

Although a large number of examples of electrical connections have been described above, it will be appreciated that the number and type of different electrical connections and electrical components is practically unlimited, and it is impossible to describe all of the ways in which the principles of the invention can be used to provide for electrical connections between dissimilar materials. For example, it is not necessary in keeping with the principles of the invention for an electrical connection to be made between dissimilar materials within an integrated circuit package, since electrical connections may also be made between dissimilar materials external to an integrated circuit package.

Referring additionally now to FIG. 4, a three-way functionally graded material 90 is representatively and schematically illustrated. The functionally graded material 90 may be used to provide electrical connections between dissimilar materials in the system 40 described above (for example, between any combination of three of the pins 32, 34, 62, wires 36, 38, 56, 58, 68, 72, 74, 78, discrete component 60, contacts 48, 50, 64, 66, traces 70, 72, 76, etc.), or the functionally graded material could be used in other systems in keeping with the principles of the invention.

The functionally graded material 90 provides a gradual transition in properties between a material at one end 92, another material at a center or middle 96, and yet another material at another end 94. For example, at the end 92 the functionally graded material 90 could be aluminum for connection to a wire or other electrical component 98 made of aluminum, at the middle 96 the functionally graded material could be copper for connection to a wire or other electrical component 100 made of copper, and at the end 94 the functionally graded material could be gold for connection to a wire or other electrical component 102 made of gold.

As another example, at the end 92 the functionally graded material 90 could be metal for connection to the electrical component 98 made of the same or a different metal, at the middle 96 the functionally graded material could be a semiconductor for connection to the electrical component 100, and at the end 94 the functionally graded material could be metal for connection to the electrical component 102 made of the same or a different metal.

Thus, it will be appreciated that a wide variety of electrical connections between dissimilar materials are made possible via use of the functionally graded material 90 in keeping with the principles of the invention. Only a few examples have been described herein, but it should be clearly understood that the invention is not limited to only these examples. A gradual transition in properties between more than two or three dissimilar materials can be provided by a functionally graded material, any combination of conductors, semiconductors, insulators, metals, non-metals, ceramics and other types of materials may be used in a functionally graded material, etc.

Yet another example of the wide variety of uses for the principles of the invention is representatively and schematically illustrated in FIG. 5. In this example, a pressure differential is applied across a conductive bulkhead 106 (such as a metal housing). It is desired to provide an electrical feedthrough 104, so that an electrical component (not shown) on one side of the bulkhead 106 may be connected to another electrical component (not shown) on the other side of the bulkhead, while maintaining the pressure holding integrity of the bulkhead and also insulating the electrical connection from the bulkhead.

For this purpose, a functionally graded material 108 is used between a conductor 110 and a sleeve 112. The conductor 110 is connected to the electrical components on either side of the bulkhead 106. The sleeve 112 is externally threaded or otherwise provided with means to seal and secure the feedthrough 104 to the bulkhead 106. Both the conductor 110 and the sleeve 112 are preferably made of metal (for example, the sleeve could be made of stainless steel and the conductor could be made of copper), but other materials could be used if desired.

The functionally graded material 108 has an inner surface 114 which is a material suitable for connection to the conductor 110. For example, if the conductor 110 is made of copper, the inner surface 114 could be copper, silver, etc. The functionally graded material 108 also has an outer surface 116 which is a material suitable for connection to the sleeve 112. For example, if the sleeve 112 is made of stainless steel, the outer surface 116 could be stainless steel, chromium, nickel, etc.

To provide electrical insulation between the inner and outer surfaces 114, 116, the functionally graded material 108 has an annular middle or central portion 118 which is an insulative material, such as ceramic, glass, etc. Note that, in this example, the gradual transition in properties between the inner surface 114, middle portion 118 and outer surface 116 is in a radial direction rather than in a linear direction. Thus, it will be appreciated that the gradual transition may be in any direction in keeping with the principles of the invention.

Of course, a person skilled in the art would, upon a careful consideration of the above description of representative embodiments of the invention, readily appreciate that many modifications, additions, substitutions, deletions, and other changes may be made to these specific embodiments, and such changes are within the scope of the principles of the present invention. Accordingly, the foregoing detailed description is to be clearly understood as being given by way of illustration and example only, the spirit and scope of the present invention being limited solely by the appended claims and their equivalents.

What is claimed is:

1. An electrical connection system, comprising:
first and second electrical components; and
an electrical connection which transmits electrical current between the first and second electrical components, the electrical connection including a functionally graded material, and
wherein a first portion of the functionally graded material comprises a material of the first electrical component, and a second portion of the functionally graded material comprises a material of the second electrical component.

2. An electrical connection system, comprising:
first and second electrical components; and
an electrical connection between the first and second electrical components, the electrical connection including a functionally graded material,
wherein an electrical contact of the first electrical component includes a first material, an electrical contact of the second electrical component includes a second material different from the first material, and the electrical connection being made between the electrical contacts of the first and second electrical components.

3. The system of claim 2, wherein the functionally graded material provides a gradual transition between the first and second materials.

4. The system of claim 2, wherein the functionally graded material includes a first portion consisting substantially exclusively of the first material, and a second portion consisting substantially exclusively of the second material.

5. An electrical connection system, comprising:
first and second electrical components; and
an electrical connection which transmits electrical current between the first and second electrical components, the electrical connection including a functionally graded material, and
wherein at least one of the first and second electrical components is selected from a group including a contact pin, an integrated circuit die, an electrical wire, a discrete electrical component, and an electrical trace attached to a substrate.

6. An electrical connection system, comprising:
first and second electrical components; and
an electrical connection which transmits electrical current between the first and second electrical components, the electrical connection including a functionally graded material, and
wherein the functionally graded material is included in at least one of a group including an electrical wire, a contact pin, and an electrical trace attached to a substrate.

7. An electrical connection system, comprising:
first and second electrical components; and
an electrical connection between the first and second electrical components, the electrical connection including a functionally graded material,
wherein the first electrical component is a wire, the second electrical component is an electrical contact, and the functionally graded material is connected directly to each of the wire and the contact.

8. The system of claim 7, wherein the wire includes an aluminum material, the electrical contact includes a gold material, and the functionally graded material provides a gradual transition between the aluminum and gold materials.

9. The system of claim 1, wherein the functionally graded material provides a gradual transition between at least first, second and third materials.

10. An electrical connection system, comprising:
a first electrical component including a first material;
a second electrical component including a second material which is dissimilar to the first material; and
a functionally graded material electrically connected between the first and second electrical components, the functionally graded material providing a gradual transition between at least the first and second materials.

11. The system of claim 10, wherein the functionally graded material further provides a gradual transition between the second material and a third material which is dissimilar to the second material.

12. The system of claim 10, wherein at least one of the first and second materials is selected from a group including a conductor, a metal, a non-metal, an insulator, a semiconductor, a ceramic, and a glass.

13. An electrical device, comprising:
a first electrical component including a first material;
a second electrical component including a second material which is dissimilar to the first material; and
a functionally graded material electrically connected between the first and second electrical components, the functionally graded material providing a gradual transition between at least the first and second materials.

14. The device of claim 13, wherein the functionally graded material further provides a gradual transition between the second material and a third material which is dissimilar to the second material.

15. The device of claim 13, wherein at least one of the first and second materials is selected from a group including a conductor, a metal, a non-metal, an insulator, a semiconductor, a ceramic, and a glass.

16. An electrical package, comprising:
a first electrical component including a first material;
a second electrical component including a second material which is dissimilar to the first material; and
a functionally graded material electrically connected between the first and second electrical components, the functionally graded material providing a gradual transition between at least the first and second materials.

17. The package of claim 16, wherein the package is at least one of a microcircuit material package, an integrated circuit package and a discrete device package.

18. The package of claim 16, wherein the functionally graded material further provides a gradual transition between the second material and a third material which is dissimilar to the second material.

19. The package of claim 16, wherein at least one of the first and second materials is selected from a group including a conductor, a metal, a non-metal, an insulator, a semiconductor, a ceramic, and a glass.

20. A downhole well tool, comprising:
firat and second electrical components; and
a functionally graded material electrically connected to the first and second electrical components, the functionally graded material providing a gradual transition between respective first and second dissimilar materials of the first and second electrical components.

21. A downhole well tool, comprising:
an electrical component; and
a functionally graded material electrically connected to the electrical component, the functionally graded material providing a gradual transition between at least first and second dissimilar materials, and
wherein the functionally graded material further provides a gradual transition between the second material and a third material which is dissimilar to the second material.

22. The tool of claim 20, wherein at least one of the first and second materials is selected from a group including a conductor, a metal, a non-metal, an insulator, a semiconductor, a ceramic, and a glass.

23. An assembly for use in a hostile environment, the assembly comprising:
a first electrical component including a first material;
a second electrical component including a second material which is dissimilar to the first material; and
a functionally graded material electrically connected between the first and second electrical components, the functionally graded material providing a gradual transition between at least the first and second materials.

24. The assembly of claim 23, wherein the hostile environment is located in at least one of a well, a foundry, a refinery, a consumer product, a medical device, an aerospace device, an automobile, a power line, a power switching station, a process control, an electrical power generation device, and an electrical power transmission device.

25. The assembly of claim 23, wherein the functionally graded material further provides a gradual transition between the second material and a third material which is dissimilar to the second material.

26. The assembly of claim 23, wherein at least one of the first and second materials is selected from a group including a conductor, a metal, a non-metal, an insulator, a semiconductor, a ceramic, and a glass.

* * * * *